United States Patent [19]
Parla et al.

[11] Patent Number: 4,982,892
[45] Date of Patent: Jan. 8, 1991

[54] SOLDER INTERCONNECTS FOR SELECTIVE LINE COUPLING

[75] Inventors: Anthony J. Parla, Charlotte; Howard F. Tepper, Essex Junction, both of Vt.

[73] Assignee: International Business Machines Corporation, Armonk, N.Y.

[21] Appl. No.: 437,156

[22] Filed: Nov. 9, 1989

[51] Int. Cl.$^5$ .................... B23K 101/42; H05K 3/34
[52] U.S. Cl. .................... 228/180.1; 228/215; 228/248; 29/846; 29/829; 174/261; 361/406
[58] Field of Search .................. 228/180.1, 180.2, 214, 228/215, 248, 256, 118, 39; 29/829, 846; 174/250, 261; 361/404, 406, 409

[56] References Cited

U.S. PATENT DOCUMENTS

| | | | |
|---|---|---|---|
| 3,528,048 | 9/1970 | Kirk | 174/261 |
| 3,681,134 | 8/1972 | Nathanson et al. | 29/829 |
| 4,296,272 | 10/1981 | Schelhorn | 361/406 |
| 4,413,309 | 11/1983 | Takahashi et al. | 361/406 |

FOREIGN PATENT DOCUMENTS

| | | | |
|---|---|---|---|
| 8606243 | 10/1986 | European Pat. Off. | 228/180.1 |
| 2837318 | 3/1980 | Fed. Rep. of Germany | 174/261 |

OTHER PUBLICATIONS

IBM Technical Disclosure Bulletin, "Nonconcentric Solder Reflow Technique for Close-Packed Lands", vol. 13, No. 1, pp. 155, 6, Jun. 1970.
IBM Technical Disclosure Bulletin, "Reusable Interconnection Matrix", vol. 13, No. 2, p. 433, Jul. 1970.

Primary Examiner—Sam Heinrich
Attorney, Agent, or Firm—Mark F. Chadurjian

[57] ABSTRACT

A structure and method for selectively forming interconnections between the interconnect lines of a printed circuit board. At the same time solder is deposited through a solder application mask to bond the modules to the board, solder is also deposited on pad interconnect structures between the interconnect lines. Thus, line interconnections can be formed at minimal additional cost, reducing the number of different boards needed to mount different sets of modules or alternate component or circuit configurations. In a preferred embodiment, the pads comprise an arcuate member and an elongated member extending within the arc described by the arcuate member. By optimizing the spacing between the members, the total area of the members, and the volume of the solder, a highly reliable solder fillet interconnection can be formed.

6 Claims, 2 Drawing Sheets

SOLDER INTERCONNECTS FOR SELECTIVE LINE COUPLING

BACKGROUND OF THE INVENTION (1) Technical Field

The invention relates generally to forming selective line-line interconnections, and more particularly to the use of additive solder processing to provide such interconnects.

(2) Background Art

In the field of semiconductor processing, the use of a lead-tin solder to provide the interconnection between a metal lead from a mounted semiconductor chip and a card (or printed circuit board) is well known. In such processes, the board is coated with an epoxy or similar material upon which the lead-tin solder will not wet (a so-called "solder-phobic" material). Then a first mask is used to selectively remove the solder-phobic material from areas in which the solder is desired. Thus, when the solder is subsequently deposited by evaporation or otherwise, it will only wet in these selected areas.

In general, due to the ever-increasing sophistication of the memory and logic chips to be mounted on a given card, the card designer must have the flexibility to selectively alter the connections between the metal interconnect lines on the card that couple the card inputs to the leads of the mounted modules. In general, if a card designer is constrained to only build one interconnect line pattern for a given set of chip modules, he/she will quickly produce a large amount of cards that differ very minimally from one another. This is especially true in memory card design. For a given memory program, a number of different memory modules (ones with all arrays functional, versus ones with ¾ of the arrays functional, versus ones with only ½ of the arrays functional) are produced. The goal of the memory card designer is to formulate a single card design that can accommodate the different pinouts associated with these modules, by providing different interconnect patterns on the card, without altering the configuration (or placement) of the interconnect lines themselves.

In the prior art, this was done by the use of "jumpers," which are discrete resistor devices of substantially zero ohms that are selectively bonded between the interconnect lines to be coupled together. In general, this is relatively time-consuming and inefficient process.

Accordingly, a need exists in the art for a simple structure and method for selectively providing connections between the metal interconnect lines on a card after the lines have been formed thereon.

SUMMARY OF THE INVENTION

It is thus an object of the invention to provide a structure and method for minimizing the number of cards that must be produced for different sets of modules.

It is another object of the invention to provide a structure and method for selectively providing connections between the metal interconnect lines on a given card after the lines have been formed thereon.

It is a further object of the invention to provide a structure and method for selectively providing these elements without the use of discrete devices.

The above and other objects of the invention are realized by the use of solder interconnects. At the same time the solder is deposited to form the connection between the module (or other components) and the card, it can be selectively deposited to bridge across selected metal interconnect lines on the card.

A feature of the invention is the use of a particular interconnect pad configuration to achieve the solder interconnect. The respective interconnect pads for lines to be joined together must be separated by a gap sufficient to prevent undesired bridging due to metal spiking, without being too great to prevent bridging by solder. Moreover, the wetting surfaces of the respective pads must be sufficient to support enough solder to bridge the gap between the pads, without being too great to spread the solder out such that the bridge does not form. At the same time, the dihedral angle of the solder fillet should be optimized, to encourage inward solder flow that promotes bridging. In the invention, all of these considerations are factored in to provide a highly reliable method and structure of solder interconnects at minimum additional processing cost. In a preferred embodiment, the interconnect pads comprise an arcuate member and an elongated member that extends within the arc described by the arcuate member.

BRIEF DESCRIPTION OF THE DRAWING

The foregoing structures and teachings of the invention will become more apparent upon a review of the description of the best mode for carrying out the invention as rendered below. In the description to follow, reference will be made to the accompanying Drawing, in which.

DESCRIPTION OF THE BEST MODE FOR CARRYING OUT THE INVENTION

Figure 1:
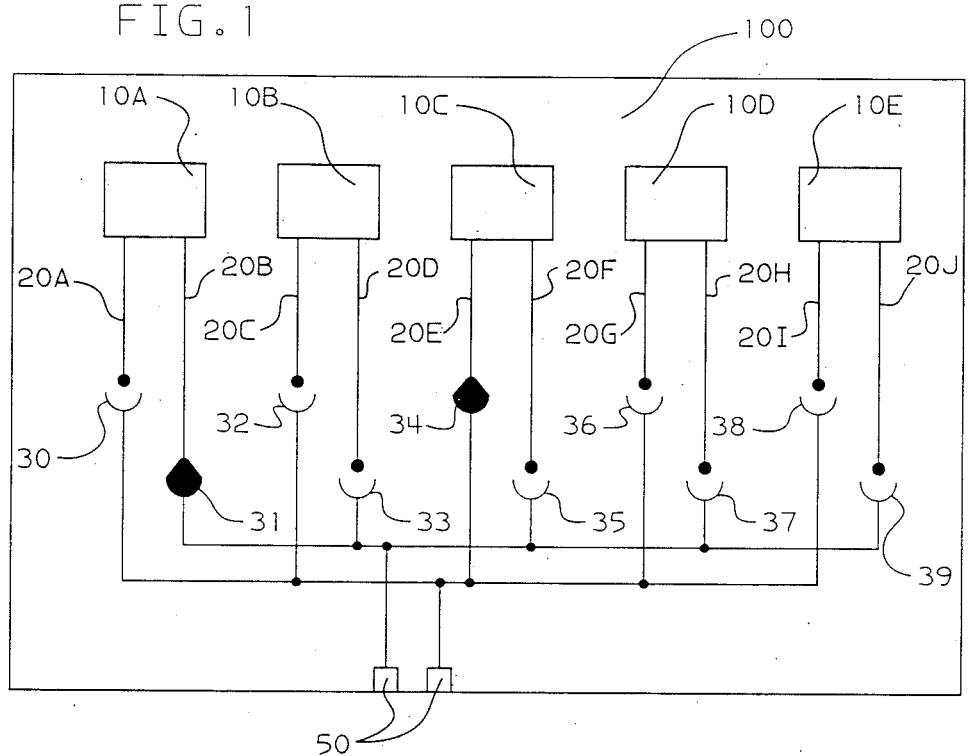
FIG. 1 is a schematic view of a card having the solder interconnects of the invention disposed thereon.

FIG. 1 shows a card having a metal interconnect pattern that has been selectively connected by use of the solder interconnect of the invention. In general, the card 100 has a plurality of modules 10A-10E disposed thereon for selective coupling to the I/O pads 50 that electrically couple the card to a receptor such as a motherboard of a personal computer or the like. While the specific card illustrated is a single in-line memory module card (or SIMM), in practice a card of any configuration could be used. Similarly, the modules 10 could be of any one of a number of well-known module types, such as the well-known So-J (small outline-J leaded) or PLCC (plastic leaded chip carrier). As previously stated, the modules 10 are coupled to the metal interconnect lines 20 of card 100 by the use of solder. Typically leads from the modules 10 are soldered to respective lead-accepting sites at the ends of the respective interconnect lines 20.

In this manner metal interconnect lines 20A and 20B are connected to respective leads of module 10A; similarly, lines 20C-20J are coupled to respective modules 10B-10E. As will be appreciated a person of skill in the printed circuit board art, in practice there are a far greater number of metal interconnect lines extending from a given module—this simplified interconnect line pattern is shown to clarify illustration of the invention. The lines terminate to form pairs of interconnect pads 30–39. Again, in practice only some of the lines would terminate in this fashion—others would follow different patterns. In the invention, solder is used to interconnect the lines at the interconnect pads. Note that pad pairs 31 and 34 have been so connected. These interconnections are formed at the same time the modules are soldered to the card. Thus, instead of mounting discrete devices after solder processing to provide the interconnection operation, by use of the invention the interconnects are provided at no extra cost to the overall process, because the same mask that defines the solder deposition for module mounting can provide the selective interconnect pattern.

By use of the invention, the same card can accommodate modules having different pinouts. For example, as shown in FIG. 1, interconnect line 20G coupled to module 10D is not connected to the input. If a new module was substituted for module 10D wherein the pin coupled to interconnect line 20G was to receive an input, this could be accommodated by simply applying a solder interconnect to interconnect pad pair 36. Thus, instead of stocking a number of different cards and/or utilizing discrete devices, all the card manufacturer has to do is use different solder application masks as a function of the different interconnect patterns desired.

In the method of the invention, a insulative printed circuit board substrate of conventional construction is metallized by the use of printed copper lines utilizing conventional processes. Then, the layer of solder-phobic epoxy is deposited as either a dry film or by flow deposition and curing, and is patterned to expose all of the lead-accepting sites of interconnection lines 20 as well as all of the interconnect pad pairs 30–39, by the use of selective etching through a mask (by wet etching or reactive ion etching). Then a solder application mask is arranged on the card, and the solder is applied through the mask.

Figure 3:
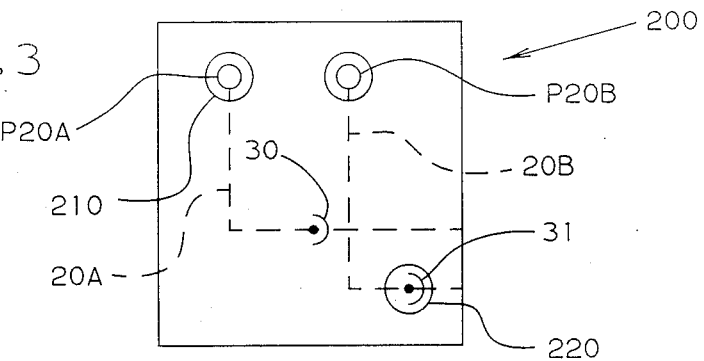
FIG. 3 is a top view of a solder application mask that is used in the process of forming the solder interconnects of the invention.
Figure 4A:
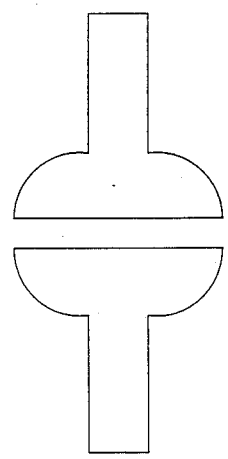
FIGS. 4A-4E are top views of other pad interconnect structures that can be used in the invention.
Figure 4B:
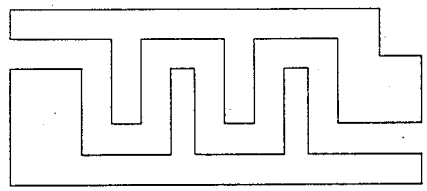
Figure 4C:
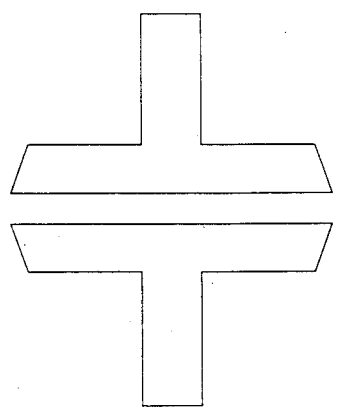
Figure 4D:
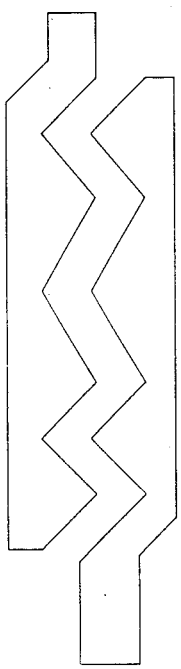
Figure 4E:
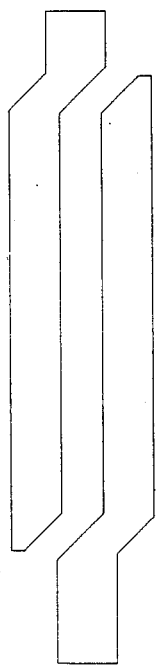

A feature of the invention is that no special solder processing is necessitated—any solder mask process used by the manufacturer to provide the module solder connections can be used to form these line-line solder interconnects. FIG. 3 illustrates an example of a portion of a solder application mask that is used to carry out the invention. The mask 200 has apertures 210 that expose the lead-accepting sites P20A, P20B of interconnect lines 20A, 20B respectively, that serve as bonding sites for the respective leads of the module to be mounted onto the card. Mask 200 also has an aperture 220 that exposes the interconnect pad 31. Note that the mask 200 does not have an aperture over interconnect pad 30 (the structures that are blocked out by mask 200 are depicted in dashed lines). Thus, when the lead/tin solder paste is subsequently applied through the mask 200 by use of a doctor blade that scrapes along the upper surface of the mask, solder will be applied to interconnect pad 31 and not to pad 30.

Figure 2:
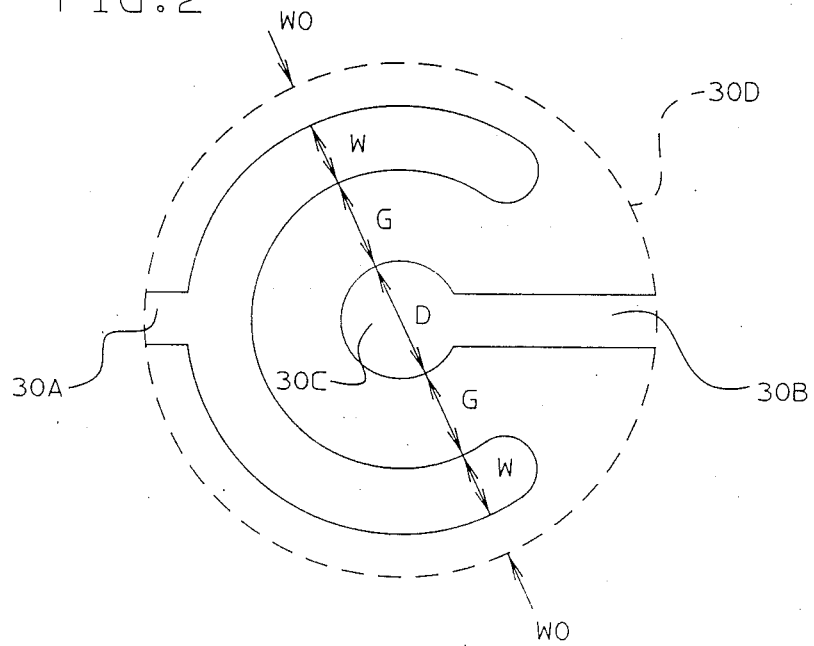
FIG. 2 is a top view of the preferred pad interconnect structure of the invention.

FIG. 2 is an expanded top view of the preferred pad interconnect structure. The structure includes an arcuate member 30A coupled to one interconnect line, and an elongated member 30B having an expanded circular end 30C that extends to the proximate center of the arcuate area defined by arcuate member 30A. These structures are formed on the insulative printed circuit board; thus, the area between arcuate member 30A and circular end 30C is insulative. All of the members of the interconnect pads are made of the same material (and formed at the same time) as the interconnect lines 20 of FIG. 1. In the invention, copper is the preferred material. The outer hatched ring 30D is formed by etching the solder-phobic material; the circle defined by ring 30D is the total area within which the solder ball (or fillet) can be formed without flowing over the rest of the surface of the card.

The particular geometry of the interconnect pads shown in FIG. 2 meets a number of important criteria. First, since the respective interconnect pad members are fairly close together, there is the possibility that the respective members may bond together due to electromigration or other spiking phenomenon. At the same time, in order to minimize the amount of solder needed to form the connection, the spacing (or gap, indicated by G in FIG. 2) should be kept as low as possible. Through experimentation, the present inventors have found that for conventional copper lines, the optimal gap G is on the order of 0.25 millimeter. The inventors have also found that if cladded lines (i.e. copper lines having a layer of conductive material thereon that tends to prevent spiking) are used, gap G can be lowered.

Another advantage of the specific configuration shown in FIG. 2 is the opening in member 30A that receives member 30B/30C. This opening provides an open path along the substrate which will permit solder flux to flow out from under the solder bridge, providing access to the area circumscribed by the pads for cleaning purposes.

The remaining criteria have to do with the nature of the lead/tin solder ball. Like many liquids, the lead/tin solder in its molten state has a certain surface tension associated with it. In the invention, this surface tension characteristic is utilized to form a single solder bridge that spans between the two pad members 30A and 30B/30C. In order to promote this process, several other considerations must be factored in when constructing the interconnect pads. First, the total area of the pads must be large enough to provide a good landing surface for the solder, without being too large such that the solder tends to ball on the respective pads without bridging the pads. This is accomplished by using lines of the same width ($W = 0.13$–$0.20$ mm) as the interconnect lines 20. Second, the pad structure should be configured such that inward flow of the solder between the respective pads is encouraged. This is done by using an amount of solder sufficient to form a high-angle solder fillet. In the invention, the total diameter of the circle 30D within which the solder can be formed ( or the "total solder wetting area") is on the order of 1.37 mm (where $D = 0.31$ mm, $G = 0.25$ mm, $W = 0.15$ mm, and $WO = 0.05$ mm). The total amount of solder deposited is sufficient to form a fillet greater than 0.20 mm high. At this volume, the bottom of the sidewalls of the fillet makes an angle (referred to as the "dihedral angle") with the horizontal surface of the pad of greater than 75 degrees. As explained in the textbook "Solders and Soldering" by H. H. Manko (McGraw-Hill 1964), a dihedral angle of this magnitude is normally to be avoided, as it indicates an insufficient degree of wetting between the solder and the underlaying pad. Here, the inventors have found that by providing fillets having angles of this magnitude, the lateral flow of the solder inward toward the center is encouraged. This insures that the solder will bridge the gap between the pad members 30A and 30B/30C.

Thus, the pad structure shown in FIG. 2 provides an optimized gap G between the respective pad members 30A and 30B/C; a pad area optimized to provide a sufficient landing surface without promoting balling that would limit lateral solder bridging; and a total landing surface (total area within the formed circle 30D) that promotes lateral solder flow. While other pad configurations such as the ones shown in FIGS. 3A–3E can be used to carry out the invention, the structure of FIG. 2 is preferred because it optimizes the above properties while having the greatest compatibility with the natural hemispherical shape typically assumed by solder in the molten state.

While the structures and teachings of the invention have been disclosed in conjunction with a particular embodiment thereof, numerous modifications can be made to such embodiment without departing from the spirit and scope of the present invention. For example, while a conventional lead/tin solder is used in the embodiment disclosed, other solder-like materials could be used.

An alternate multi-plane structure could be made having the arcuate pad (30A) be a continuous ring. The other pad member 30C would be interconnected by means of a plated through via hole to another plane in or on the substrate, on which it would pick up an associated land 30B.

What we claim is:

1. A method of mounting at least one module having a plurality of output leads on a printed circuit board having a plurality of interconnection lines formed thereon, each of the plurality of interconnection lines terminating at one end with a lead acceptor site, and at least some of said interconnection lines having interconnect pads therebetween, comprising the steps of arranging a mask over the printed circuit board so as to expose at least some of the lead acceptor sites and selected ones of said interconnect pads, and depositing solder through said mask so as to bond the plurality of output leads of the module to respective ones of the lead acceptor sites while simultaneously forming connections between selected ones of said plurality of interconnection lines.

2. A method of metallizing a printed circuit board, comprising the steps of:
    forming interconnection lines on the printed circuit board, at least some of said interconnection lines having a lead-accepting site, and at least some of said interconnection lines having an interconnection pad structure adjacent to an interconnection pad structure of an adjacent interconnection line, so as to form pairs of interconnection pad structures;
    depositing a solder-phobic material on the printed circuit board, and patterning said material to expose said lead-accepting sites and said interconnection pad structures;
    arranging a mask on said printed circuit board, said mask exposing said lead-accepting sites and selected ones of said pairs of interconnection pad structures; and
    depositing solder through said mask so as to bond leads of a module to said lead-accepting sites while simultaneously establishing interconnections between selected ones of said interconnection lines.

3. The method as recited in claim 2, wherein said interconnect lines comprise copper and said solder comprises lead/tin.

4. The method as recited in claim 3, wherein said solder-phobic material comprises epoxy.

5. The method as recited in claim 3, wherein said solder is deposited through said mask by the use of a doctor blade.

6. The method as recited in claim 2, wherein each of said pairs of interconnection pad structures comprises a first arcuate pad structure, and a second elongated pad structure that extends within the arc defined by said arcuate pad structure.

* * * * *